(12) United States Patent
Studebaker

(10) Patent No.: US 6,448,637 B1
(45) Date of Patent: Sep. 10, 2002

(54) HERMETICALLY SEALED INTEGRATED CIRCUIT PACKAGE INCORPORATING PRESSURE RELIEF VALVE FOR EQUALIZING INTERIOR AND EXTERIOR PRESSURES WHEN PLACED IN SPACEBORNE ENVIRONMENT

(75) Inventor: S. James Studebaker, Indian Harbour Beach, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/995,524

(22) Filed: Nov. 28, 2001

(51) Int. Cl.[7] .................. H01L 23/22; H01L 23/24; H01L 23/12; H01L 23/20; H01L 23/16; H01L 23/58

(52) U.S. Cl. .................. 257/678; 257/704; 257/682; 257/683

(58) Field of Search .................. 257/659, 667, 257/678, 704, 710, 773, 785, 787, 682, 683

(56) References Cited

U.S. PATENT DOCUMENTS

| | | | |
|---|---|---|---|
| 3,851,221 A | 11/1974 | Beaulieu et al. ............ 317/100 |
| 4,365,715 A | 12/1982 | Egli ......................... 206/524.8 |
| 4,426,769 A | 1/1984 | Grabbe ........................ 29/588 |
| 4,866,506 A | 9/1989 | Nambu et al. ................. 357/72 |
| 5,354,133 A | 10/1994 | Rapparini .................... 383/103 |
| 5,543,364 A | 8/1996 | Stupian et al. ............... 437/210 |
| 5,603,892 A | 2/1997 | Grilletto et al. ................ 422/3 |
| 5,612,576 A | 3/1997 | Wilson et al. ............... 257/788 |
| 6,057,597 A | * 5/2000 | Farnworth et al. .......... 257/710 |
| 6,124,632 A | * 9/2000 | Lieh-His Lo et al. ....... 257/678 |
| 6,184,504 B1 | 2/2001 | Cardella ..................... 219/513 |

* cited by examiner

Primary Examiner—Nathan J. Flynn
Assistant Examiner—Victor A. Mandala, Jr.
(74) Attorney, Agent, or Firm—Allen, Dyer, Doppelt, Milbrath & Gilchrist, P.A.

(57) ABSTRACT

A hermetically sealed protective package for a space-deployable electronic circuit includes a pressure relief valve. The pressure relief valve is closed during assembly and testing of the circuit in an earth borne environment, so as to prevent the entry of moisture and foreign matter and maintain pressure equalization between the interior volume and the exterior of the hermetically sealed package. The valve is opened when the package is placed in the 'clean' vacuum ambient of a spaceborne environment, so as to vent atmospheric pressure from the interior volume of the package and prevent differential pressure-induced stresses on the package.

4 Claims, 1 Drawing Sheet

HERMETICALLY SEALED INTEGRATED CIRCUIT PACKAGE INCORPORATING PRESSURE RELIEF VALVE FOR EQUALIZING INTERIOR AND EXTERIOR PRESSURES WHEN PLACED IN SPACEBORNE ENVIRONMENT

FIELD OF THE INVENTION

The present invention relates in general to the packaging and protection of electronic circuits and components, and is particularly directed to a new and improved hermetically sealed electronic circuit package, containing a pressure relief valve. The pressure relief valve is closed during assembly and testing in the atmospheric pressure of an earth borne facility, so as to prevent the entry of foreign matter while equalizing exterior and interior pressure. The valve is subsequently controllably opened in the course of deploying the package into the generally contaminant-free vacuum of a spaceborne environment. This serves to effectively continuously maintain equalization of interior and exterior pressures, and thereby reduce mechanical stresses on the packaging structure, without subjecting the electronics to the potential introduction of contaminants.

BACKGROUND OF THE INVENTION

High reliability integrated circuits are customarily packaged in hermetically sealed enclosures, in order to protect the packaged circuits and components from potential sources of degradation, such as foreign matter, moisture, corrosives, and the like. The use of such packaging is particularly critical where such circuits of the type intended for spaceborne applications, and therefore can be expected to be placed in a very humid ambient that typify launch sites geographically located near the earth's equator.

Because a spaceborne environment is essentially a contaminant-free vacuum, the structural integrity of the packaging architecture that houses and hermetically seals the circuit must be very robust, since the interior pressure of the package is that (1 Atm.=14.7 lb./sq.in.) of its earth borne assembly, testing and prelaunch facilities, and thus induces stresses in the packaging materials. From a practical standpoint, this means that the hermetically sealing structure is often relatively large and bulky (mechanically complex)—which adds unwanted bulk and weight to the payload, in addition to the entailing the use of a costly assembly process.

SUMMARY OF THE INVENTION

In accordance with the present invention, the above-described drawbacks associated with conventional hermetically sealed electronic circuit packaging structures intended for spaceborne applications are effectively obviated by incorporating a controllable pressure relief valve into the package. The pressure relief valve may be a custom made valve, or one selected from a variety of commercially available valves types. Such valves include, but are not limited to a standard 'pop-up valve' of the type that maintains a seal until a given pressure differential is reached and then opens; a mechanical valve, such as a diaphragm; an electromechanical valve, such as a solenoid-actuated microvalve; and an electro-thermal valve of the type that employs a meltable seal that opens in response to the application of a prescribed electrical current.

The incorporation of a pressure relief valve into the hermetically sealed packaging structure serves two purposes. First, it maintains the hermetically sealed integrity of the package during assembly and testing in the (equalized) atmospheric pressure of an earth borne facility, and thereby protects the components from its surrounding (potentially degrading) ambient prior to launch and space deployment. Secondly, upon being controllably opened in the course of placing the package in the generally contaminant-free vacuum of a spaceborne environment, the pressure relief valve enables the package interior to be vented, and thereby equalizes the interior pressure to that of the exterior ('cleanroom'—like) vacuum of the surrounding spaceborne environment. This interior/exterior pressure equalization functionality reduces mechanical stresses on the packaging structure, and thus allows its mechanical complexity to be considerably simplified, thereby reducing weight and cost.

DETAILED DESCRIPTION

Figure 1:
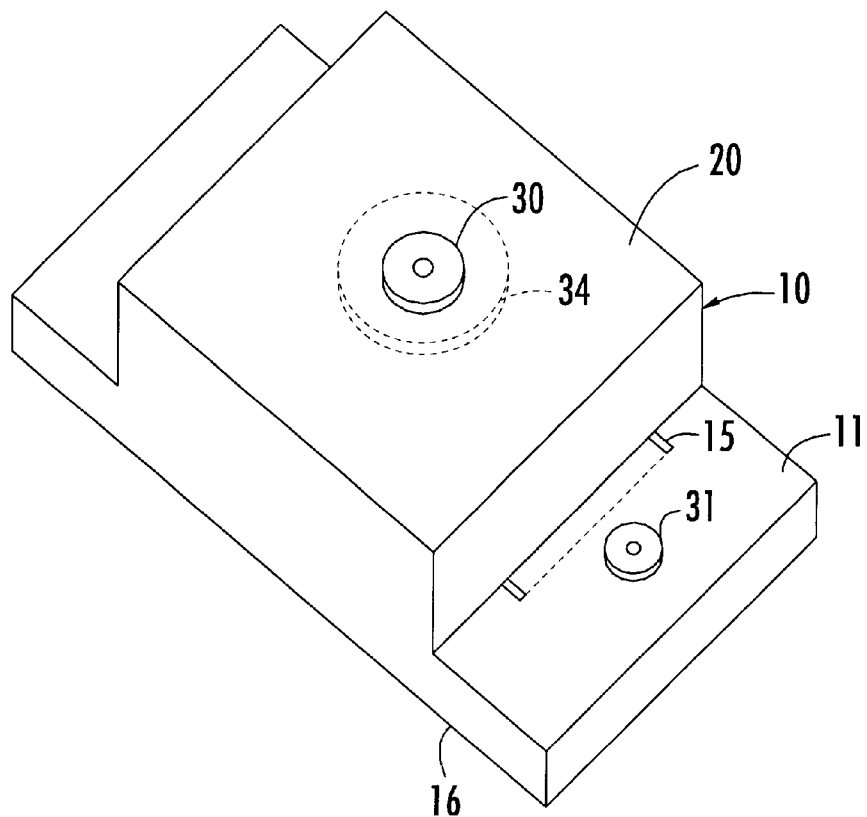
FIG. 1 is a diagrammatic perspective view of a hermetically sealed electronic circuit package that incorporates a space deployment-responsive, pressure relief valve in accordance with the present invention.
Figure 2:
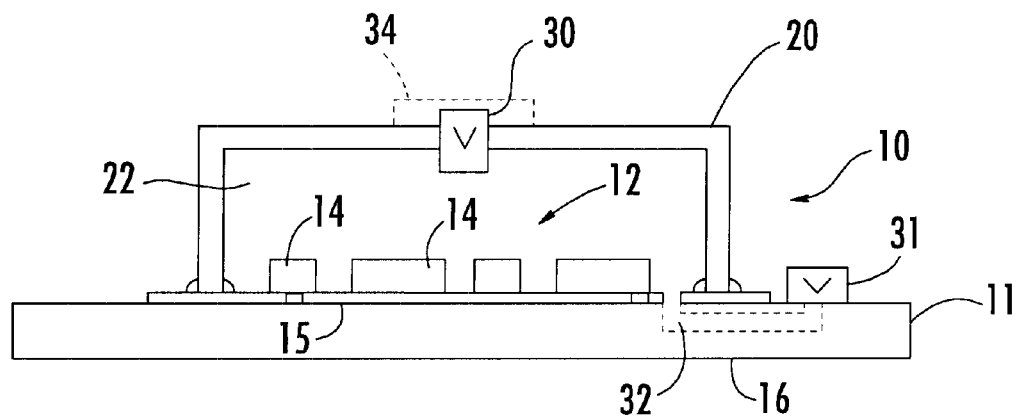
FIG. 2 is a diagrammatic side view of the pressure relief valve-incorporating hermetically sealed electronic circuit package of FIG. 1.

Attention is now directed to the respective diagrammatic perspective and side views of FIGS. 1 and 2, which illustrate a hermetically sealed electronic circuit package that incorporates a space deployment-responsive pressure relief valve in accordance with the present invention. The package itself, shown at 10, may comprise a conventional enclosure of the type used to house and hermetically seal electronic components for use in an (atmospheric pressure) earth borne environment, rather than a more costly, relatively robust and complex housing configuration designed for spaceborne applications.

As such, the invention does contemplate the introduction of a new type of design or materials used in the hermetic sealing structure, per se. Rather, the invention involves equipping a relatively low cost conventional hermetic sealing package of the type customarily used for earth borne applications with a pressure relief valve. The pressure relief valve is selectively controlled, so that it remains closed in an earth borne environment, and thereby protects the interior of the enclosure from potential degrading influences present in the surrounding ambient (e.g., moisture, contaminants and the like). On the other hand, the valve is subsequently opened when deployed in a spaceborne environment (contaminant-free vacuum), so as to equalize interior and exterior pressures and reduce mechanical stresses on the packaging structure.

For purposes of providing a diagrammatic illustration, the protective package 10 is shown as having a mounting base or carrier 11, which supports an electronic circuit 12. The circuit is shown as comprising a substrate 13 populated with various integrated circuit components 14 and interconnect 15 therefor. External electrical connections to and from the electronic circuit 12 may be effected through one or more hermetically sealed vias and the like from the backside 16 of the carrier 11, or through an industry-standard, surface-mounted interconnection structure accessible via the carrier 11.

In addition to the inherent hermetic sealing properties of its material and configuration, a surface region of the carrier 11 surrounding the electronic circuit 12 is engaged by and sealed against an air and moisture tight lid or closure 20, so as to define a hermetically sealed interior volume 22 of the package in which the circuit 12 is protected. As a non-limiting example, the lid and the carrier may be made of a material such as Kovar and the like, customarily used in hermetical sealing applications.

As pointed out above, pursuant to the invention, the ability to provide effectively continuous pressure equalization (for reducing mechanical stresses in the protective packaging), while protecting the interior volume of the package from the entry of foreign matter, moisture and the like, is accomplished by incorporating a controllable pressure relief valve 30 into the package. In a non-limiting embodiment, the pressure relief valve 30 may be incorporated into the lid 20 proper. Alternatively, the valve may be located at another functionally equivalent location of the packaging architecture, such as but not limited to a location 31 that is coupled with a venting passageway in the carrier 11, shown in broken lines 32.

The pressure relief valve itself may have a custom configuration, or it may comprise a valve be selected from a variety of commercially available valves components, such as a 'pop-up' valve, that maintains a seal until a given pressure differential is reached and then opens; a mechanical valve (e.g., diaphragm); an electromechanical valve, such as a solenoid-actuated microvalve; and an electro-thermal valve having a meltable seal that opens in response to the application of a prescribed electrical current. To accommodate testing of the electronic circuit in its hermetically sealed state, a removable protective shield, shown at 34, may be temporarily placed over the pressure relief valve. Once testing is complete, the protective shield is removed, to allow the pressure relief valve to function as intended.

As described previously, the pressure relief valve has a two-fold function. On the one hand, it maintains the hermetically sealed integrity of the package during assembly and testing in the (equalized) atmospheric pressure of an earth borne facility. This ensures that the electronic components will be protected from the surrounding ambient prior to launch and space deployment. On the other hand, as the package is placed in the generally contaminant-free vacuum of a spaceborne environment, the pressure relief valve is opened, which allows the atmospheric pressure within the package interior to be vented, and equalizes the interior pressure to that of the vacuum of the spaceborne environment which has the non-contaminating properties of a cleanroom vacuum. By eliminating the pressure differential between the package interior and its surrounding environment, the problem of mechanical stresses is eliminated, allowing the use of a relatively low cost and low structural complexity hermetic sealing structure.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. A protection packaging structure for a space-deployable electronic circuit comprising:

a hermetically sealed enclosure having an interior volume containing said electronic circuit at a pressure on the order of atmospheric pressure in an earthborne environment, so as to provide for pressure equalization between said interior volume and the exterior of said hermetically sealed enclosure when said protection packaging structure is in said earthborne environment; and a pressure relief valve coupled with said hermetically sealed enclosure, said pressure relief valve being closed in said earthborne environment, so as to prevent the entry of moisture and foreign matter, and also maintain pressure equalization between said interior volume and the exterior of said hermetically sealed enclosure when said protection packaging structure is in said earthborne environment, and thereafter being opened when said protection packaging structure is in a spaceborne environment, so as to vent atmospheric pressure therefrom and thereby provide for pressure equalization between said interior volume and the exterior of said hermetically sealed enclosure.

2. The protection packaging structure according to claim 1, further including a removable protective shield placed over said pressure relief valve during testing of said electronic circuit in said earth borne environment.

3. A method of protecting a space-deployable electronic circuit comprising the steps of:

(a) installing said electronic circuit in the interior volume of a hermetically sealed enclosure having a pressure relief valve coupled therewith, said interior volume having a pressure on the order of atmospheric pressure in an earth borne environment;

(b) maintaining said pressure relief valve in a closed state when said hermetically sealed enclosure is in said earth borne environment, so as to prevent the entry of moisture and foreign matter, and also equalize pressure between said interior volume and the exterior of said hermetically sealed enclosure; and (c) in the course of said hermetically sealed enclosure containing said electronic circuit being transitioned from said earth borne environment to said spaceborne environment, opening said pressure relief valve, so as to allow atmospheric pressure in the interior volume of said hermetically sealed enclosure to vent therefrom, and thereby provide for pressure equalization between said interior volume and the exterior of said hermetically sealed enclosure in said spaceborne environment.

4. The method according to claim 1, wherein step (a) includes placing a removable protective shield placed over said pressure relief valve during testing of said electronic circuit in said earth borne environment, and thereafter removing said protective shield.

* * * * *